United States Patent
Kim et al.

(10) Patent No.: US 8,188,512 B2
(45) Date of Patent: May 29, 2012

(54) GROWTH OF GERMANIUM EPITAXIAL THIN FILM WITH NEGATIVE PHOTOCONDUCTANCE CHARACTERISTICS AND PHOTODIODE USING THE SAME

(75) Inventors: Sang Hoon Kim, Seoul (KR); Gyung Ock Kim, Seoul (KR); Dong Woo Suh, Daejeon (KR); Ji Ho Joo, Gyeonggi-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 23 days.

(21) Appl. No.: 12/536,098

(22) Filed: Aug. 5, 2009

(65) Prior Publication Data

US 2010/0133585 A1    Jun. 3, 2010

(30) Foreign Application Priority Data

Dec. 3, 2008  (KR) .................. 10-2008-0121611
Mar. 26, 2009  (KR) .................. 10-2009-0025685

(51) Int. Cl.
*H01L 31/028* (2006.01)
*C03B 23/06* (2006.01)

(52) U.S. Cl. . 257/184; 257/190; 257/192; 257/E31.011; 117/88

(58) Field of Classification Search ............ 117/88; 257/184, E31.011, 190, 192
See application file for complete search history.

(56) References Cited

U.S. PATENT DOCUMENTS

| | | | |
|---|---|---|---|
| 7,303,979 | B2 | 12/2007 | Yamagata et al. |
| 7,329,593 | B2 | 2/2008 | Bauer et al. |
| 2008/0121805 | A1* | 5/2008 | Tweet et al. ............... 250/332 |
| 2010/0230713 | A1* | 9/2010 | Minemoto et al. ......... 257/103 |

FOREIGN PATENT DOCUMENTS

| | | |
|---|---|---|
| KR | 1020050063642 | 6/2005 |
| WO | WO-00/15885 A1 | 3/2000 |
| WO | WO-2004/001857 A1 | 12/2003 |

OTHER PUBLICATIONS

Luan et al., "High-quality Ge epilayers on Si with low threading-dislocation densities" Applied Physics Letters, vol. 75, No. 19, pp. 2909-2911, Nov. 8, 1999.
Kim et al., "Enhanced frequency response associated with negative photoconductance in an InGaAs/InAlAs avalanche photodetector" Applied Physics Letters, vol. 83, No. 6, pp. 1249-1251, Aug. 11, 2003.

* cited by examiner

*Primary Examiner* — Hung Vu
*Assistant Examiner* — Vernon P Webb
(74) *Attorney, Agent, or Firm* — Rabin & Berdo, P.C.

(57) ABSTRACT

A method of growing a germanium (Ge) epitaxial thin film having negative photoconductance characteristics and a photodiode using the same are provided. The method of growing the germanium (Ge) epitaxial thin film includes growing a germanium (Ge) thin film on a silicon substrate at a low temperature, raising the temperature to grow the germanium (Ge) thin film, and growing the germanium (Ge) thin film at a high temperature, wherein each stage of growth is performed using reduced pressure chemical vapor deposition (RPCVD). The three-stage growth method enables formation of a germanium (Ge) epitaxial thin film characterized by alleviated stress on a substrate, a lowered penetrating dislocation density, and reduced surface roughness.

6 Claims, 10 Drawing Sheets

| File Name | 2-1 .tif |
| --- | --- |
| Head Mode | NC-AFM |
| Source | Topography |
| Data Width | 512 (pxl) |
| Data Height | 512 (pxl) |
| X Scan Size | 10 (μm) |
| Y Scan Size | 10 (μm) |
| Scan Rate | 1 (Hz) |
| Set Point | -0.35 (μm) |
| Data Gain | -110.72E-6 (μm/step) |

GROWTH OF GERMANIUM EPITAXIAL THIN FILM WITH NEGATIVE PHOTOCONDUCTANCE CHARACTERISTICS AND PHOTODIODE USING THE SAME

CROSS-REFERENCE TO RELATED APPLICATION

This application claims priority to and the benefit of Korean Patent Application Nos. 10-2008-0121611, filed Dec. 3, 2008 and 10-2009-0025685, filed Mar. 26, 2009, the disclosure of which is incorporated herein by reference in its entirety.

BACKGROUND

1. Field of the Invention

The present invention relates to a method of growing a germanium (Ge) epitaxial thin film required for fabricating a germanium (Ge) photodiode, and more particularly, to a method of growing a germanium (Ge) epitaxial thin film having superior characteristics of relaxed stress, low penetrating dislocation density, and reduced surface roughness on a silicon substrate using reduced pressure chemical vapor deposition (RPCVD), and a photodiode using the same.

2. Discussion of Related Art

A new device using a silicon (Si) and silicon-germanium (SiGe) or germanium (Ge) heterojunction structure has been developed in the last several decades.

In particular, a high-speed heterojunction bipolar transistor (HBT) using a difference in band-gap energy between silicon (Si) and germanium (Ge), a dual-channel of a modulation doped field effect transistor (MODFET) using high mobility characteristics exhibited in a stress-applied Si/Ge thin film or a metal oxide semiconductor field effect transistor (MOSFET) are mainly being fabricated.

Further, research into fabricating a photodiode for optical communications in a region ranging from 1.3 to 1.55 μm that is an optical absorption wavelength band of germanium (Ge) band-gap energy (0.67 eV) has recently been under way. For this purpose, a method of obtaining a Si—Ge buffer layer exhibiting excellent characteristics or a pure germanium (Ge) thin film on a silicon substrate is being researched, and results thereof are being reported.

A lattice strain f that is a major parameter in a Si/Ge heterojunction structure may be represented by the following equation.

$$f=(a_{layer}-a_{sub})/a_{sub}$$

Here, $a_{sub}$ denotes a lattice constant of a substrate, $a_{layer}$ denotes a lattice constant of a deposited layer, and a lattice strain f between silicon (Si) and germanium (Ge) is 4.2%. Further, different equilibrium critical thicknesses $t_c$ are given according to a deposition temperature of germanium (Ge). As the deposition temperature of the germanium (Ge) is increased, $t_c$ decreases. When the thickness is less than $t_c$, a lattice structure exists in a stable state by elastic deformation to a square, whereas when the thickness is greater than or equal to $t_c$, energy required to produce a misfit dislocation becomes smaller than elastic deformation energy of the deposited germanium (Ge), and a stress relaxation phenomenon occurs due to the misfit dislocation. $t_c$ depends on a nucleus production position or propagation mechanism of the dislocation as well as a deposition temperature.

Since a germanium (Ge) epitaxial layer is a part in which an active device is to be formed in a germanium (Ge) photodiode, the germanium (Ge) epitaxial layer must satisfy several requirements. First, a stress resulting from the misfit dislocation should be sufficiently relaxed. Second, a surface of the thin layer should be smooth. A rough surface with a wave pattern may be an obstacle to a process of fabricating a device. Third, a penetrating dislocation which may occur while the stress is relaxed should not be propagated to a surface of the germanium (Ge) thin film. The penetrating dislocation which is propagated to the surface may serve as a defect in a thin film to be formed thereon, and device characteristics may be deteriorated or a leakage current may be generated.

However, the existing adjusted diffraction factors may function to enable carriers to cause transition effects between energy valleys, and thus negative resistance effects may occur. An optical device exhibiting such negative resistance effects may have fast frequency response characteristics. For example, as disclosed by G. Kim et al. (Appl. Phys. Lett. 83, 1249, 2003), it has been reported that a high-performance photodiode based on a group III-V semiconductor exhibits enhanced frequency response characteristics based on negative photoconductance.

Finally, in order to accomplish commercialization, a process of a germanium (Ge) epitaxial thin film should be simplified to reduce a process time.

A conventional technique includes a two-stage growth method including high and low temperatures, and it is reported that after the two-stage growth method, a method in which repeating annealing at a temperature of 780° C. for 10 minutes and at a temperature of 900° C. for 10 minutes ten times is a germanium (Ge) epitaxial growth method that is most likely to exhibit excellent characteristics. This process is performed using costly ultra-high vacuum chemical vapor deposition (UHVCVD) equipment that is unsuitable for commercialization, and takes four hours to complete only a post-annealing process. Also, the annealing performed at a high temperature may cause mutual diffusion between silicon (Si) and germanium (Ge), and thus a Si—Ge layer is formed on an interface thereof. This changes a band-gap and influences device characteristics.

SUMMARY OF THE INVENTION

The present invention is directed to a method of growing a high-quality germanium (Ge) epitaxial thin film in which penetrating dislocation density is adjusted by a three-stage growth method including low, rising and high temperatures using reduced pressure chemical vapor deposition (RPCVD) that exhibits excellent mass production, and surface roughness is reduced.

The present invention is also directed to a photodiode including a high-quality germanium (Ge) epitaxial thin film in which penetrating dislocation density is adjusted, and surface roughness is reduced.

One aspect of the present invention provides a method of growing a germanium (Ge) epitaxial thin film, including: growing a germanium (Ge) thin film on a silicon substrate at a low temperature; growing the germanium (Ge) thin film while raising a temperature; and growing the germanium (Ge) thin film at a high temperature, wherein each stage of growth is performed using reduced pressure chemical vapor deposition (RPCVD).

Growing the germanium (Ge) thin film at a low temperature may be performed at a deposition temperature of 350 to 450° C. under a pressure of 10 to 90 Torr to grow the thin film to a thickness of 80 to 120 nm. Also, growing while raising the temperature may be performed by raising the temperature from 350 to 450° C. to 600 to 700° C. at a rate of 5 to 15° C.

per minute to grow the thin film to a thickness of 180 to 220 nm. Further, growing the germanium (Ge) thin film at a high temperature may be performed at a deposition temperature of 600 to 700° C. under a pressure of 10 to 90 Torr to grow the thin film to a thickness of 500 to 2500 nm.

A deposition rate in raising the temperature to grow the germanium (Ge) thin film is the same as that in growing the germanium (Ge) thin film at a low temperature, and a deposition rate in growing the germanium (Ge) thin film at a high temperature is at least twice that in growing the germanium (Ge) thin film at a low temperature.

Another aspect of the present invention provides a photodiode including a germanium (Ge) epitaxial thin film, including: a low-temperature germanium (Ge) thin film grown on a silicon substrate at a low temperature; a rising-temperature germanium (Ge) thin film grown on the low-temperature germanium (Ge) thin film while a temperature is raised; and a high-temperature germanium (Ge) thin film grown on the rising-temperature germanium (Ge) thin film at a high temperature.

The low-temperature germanium (Ge) thin film may be grown at a deposition temperature of 350 to 450° C. under a pressure of 10 to 90 Torr to be formed to a thickness of 80 to 120 nm, the rising-temperature germanium (Ge) thin film may be grown by raising a temperature from 350 to 450° C. to 600 to 700° C. at a rate of 5 to 15° C. per minute to be formed to a thickness of 180 to 220 nm, and the high-temperature germanium (Ge) thin film may be grown at a deposition temperature of 600 to 700° C. under a pressure of 10 to 90 Torr to be formed to a thickness of 500 to 2500 nm.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1:
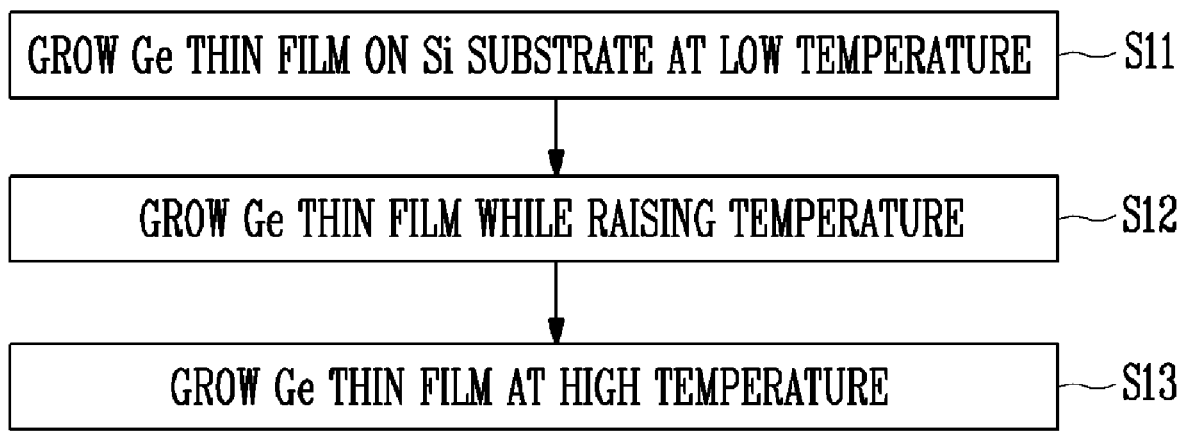
FIG. 1 illustrates a process of a three-stage growth method by which a germanium (Ge) epitaxial thin film is fabricated according to an exemplary embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. In the drawings, portions irrelevant to a description of the present invention are omitted for clarity, and like reference numerals denote like elements.

The present invention will be described in detail with reference to the accompanying drawings.

FIG. 1 illustrates a process of a three-step growth method by which a germanium (Ge) epitaxial thin film is fabricated according to one exemplary embodiment of the present invention.

Referring to FIG. 1, a method of growing the germanium (Ge) epitaxial thin film according to the present invention includes: growing a germanium (Ge) thin film on a silicon substrate at a low temperature (S11); growing the germanium (Ge) thin film while raising the temperature (S12); and growing the germanium (Ge) thin film at a high temperature (S13). Deposition in each stage of growth is performed using reduced pressure chemical vapor deposition (RPCVD).

In growing the germanium (Ge) thin film at a low temperature (S11), a deposition temperature is maintained at 350 to 450° C., and a deposition pressure is maintained at several tens of Torr, more specifically, 10 to 90 Torr to perform the process. The reason for performing the process at a low temperature of about 400° C. is that under the process conditions of a temperature exceeding 500° C., a surface tension causes the germanium (Ge) layer to show three-dimensional growth in a hemisphere form rather than planar growth, thus increasing surface roughness.

Further, $GeH_4$ gas diluted into 10 to 30 vol % with hydrogen may be used as a source gas for depositing the low-temperature germanium (Ge) thin film, hydrogen gas may be used as a carrier gas, a flow rate of the source gas may be 150 to 250 sccm, and a flow rate of the carrier gas may be 10 to 30 slm. Moreover, the low-temperature germanium (Ge) thin film may be formed to a thickness of about 80 to about 120 nm.

Beyond this range, an effect resulting from germanium (Ge) segregation in annealing may cause the thin film to have an extremely rough surface.

Misfit dislocations appear on the entire surface of the low-temperature germanium (Ge) thin film grown under the above conditions in order to relax a stress caused by a difference in lattice constant between silicon (Si) and germanium (Ge), and most of the dislocations in a penetrating dislocation form spread onto a surface. Moreover, the surface roughness is reduced.

In growing the germanium (Ge) thin film while raising the temperature (S12), the deposition temperature is raised from 350 to 450° C. to 600 to 700° C. Here, the temperature may be raised by 5 to 15° C. per minute. During the deposition, a pressure may be within a range of 10 to 90 Torr.

Also, germane ($GeH_4$) gas may be used as the source gas, and the gas may flow at a flow rate of 10 to 30 sccm to perform the process.

In growing the germanium (Ge) thin film while raising the temperature, the thin film may be deposited at a rate of 50 to 200 Å/min, which is the same as that in growing the germanium (Ge) thin film at a low temperature, and the thin film in growing the germanium (Ge) thin film while raising the temperature may deposited to a thickness of 180 to 220 nm.

In growing the germanium (Ge) thin film at a high temperature (S13), a deposition temperature is within the range of 600 to 700° C., a deposition pressure is within the range of 10 to 90 Torr, $GeH_4$ gas is used as a source gas, and the gas flows at a flow rate of 30 to 50 sccm to perform the process.

Here, the deposition rate is at least twice as fast as that in growing the germanium (Ge) thin film at a low temperature and growing the germanium (Ge) thin film while raising the temperature, and the deposition may be at least three times as fast. In growing the germanium (Ge) thin film at a high temperature, the thin film may be deposited to a thickness of 500 to 2500 nm. The faster deposition rate in growing the germanium (Ge) thin film at a high temperature may enable the total process time for growing the germanium (Ge) thin film to be reduced.

The germanium (Ge) epitaxial thin film grown using the three-stage growth method including low, rising and high temperatures exhibits a reduced misfit dislocation and penetrating dislocation compared to that generated in growing the germanium (Ge) thin film at a low temperature, so that the penetrating misfit dislocation on the germanium (Ge) thin film surface is low, and surface roughness is excellent.

Figure 2:
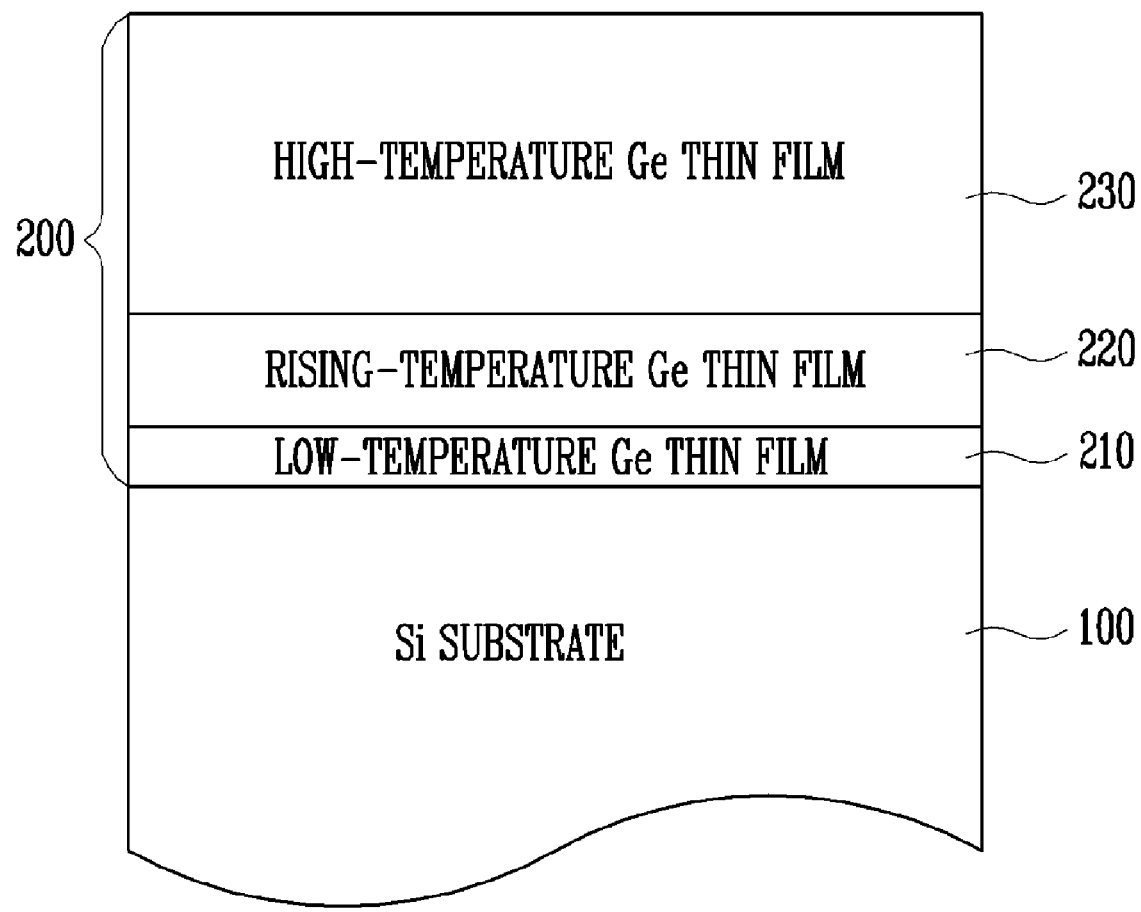
FIG. 2 is a cross-sectional view of a germanium (Ge) epitaxial thin film grown on a silicon substrate by a three-stage growth method according to an exemplary embodiment of the present invention.

Accordingly, as illustrated in FIG. 2, the germanium (Ge) epitaxial thin film 200 deposited on the silicon substrate 100 using the three-stage growth method including low, rising and high temperatures includes a low-temperature germanium (Ge) thin film 210, a rising-temperature germanium (Ge) thin film 220 disposed on the low-temperature germanium (Ge) thin film and a high-temperature germanium (Ge) thin film 230 disposed on the rising-temperature germanium (Ge) thin film, and these components constitute a photodiode.

EXAMPLE 1

Growing Low-Temperature Germanium (Ge) Thin Film

Under RPCVD conditions, a low-temperature germanium (Ge) thin film 210 was deposited to be grown on a silicon substrate 100 to a thickness of 100 nm at a deposition rate of 100 Å/min by flowing $GeH_4$ gas diluted into 20 vol % with hydrogen at a flow rate of 150 sccm under a temperature of 420° C. and a pressure of 60 Torr, and flowing hydrogen gas as a carrier gas at a flow rate of 20 slm.

Growth of Rising-Temperature Germanium (Ge) Thin Film

Then, under RPCVD conditions, a temperature of the low temperature germanium (Ge) thin film 210 was raised from 420° C. to 680° C. at a rate of 12° C. per minute, and $GeH_4$ gas was injected at a flow rate of 10 sccm under a pressure of 60 Torr, and thus a rising-temperature germanium (Ge) thin film 220 was grown to a thickness of 200 nm at the same deposition rate as that of the low-temperature germanium (Ge) thin film.

Growth of High-Temperature Germanium (Ge) Thin Film

Subsequently, under RPCVD conditions, $GeH_4$ gas was injected onto the rising-temperature thin film 220 at a flow rate of 50 sccm under a deposition temperature of 680° C. and a pressure of 60 Torr to grow a high-temperature germanium (Ge) thin film 230 to a thickness of 700 nm at a deposition rate three times as fast as that of the low-temperature germanium (Ge) thin film.

EXPERIMENTAL EXAMPLE

Observation through Transmission Electron Microscope (TEM)

Figure 3:
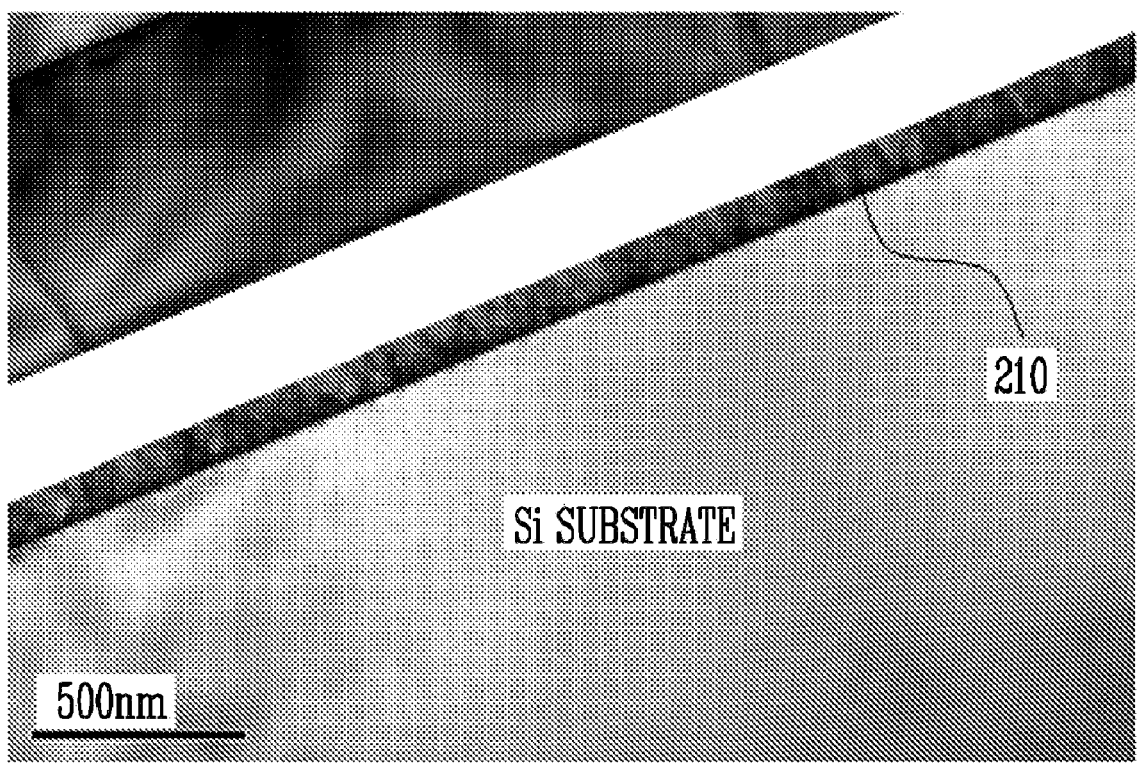
FIG. 3 is a TEM image of a cross-section of a low-temperature germanium (Ge) thin film according to an exemplary embodiment of the present invention.

A cross section of the low-temperature germanium (Ge) thin film 210 grown in Example 1 was observed through a TEM, and the observed results are illustrated in FIG. 3. Further, a TEM with high resolution was used to confirm crystallinity, and the confirmed results are illustrated in FIG. 4.

Figure 5:
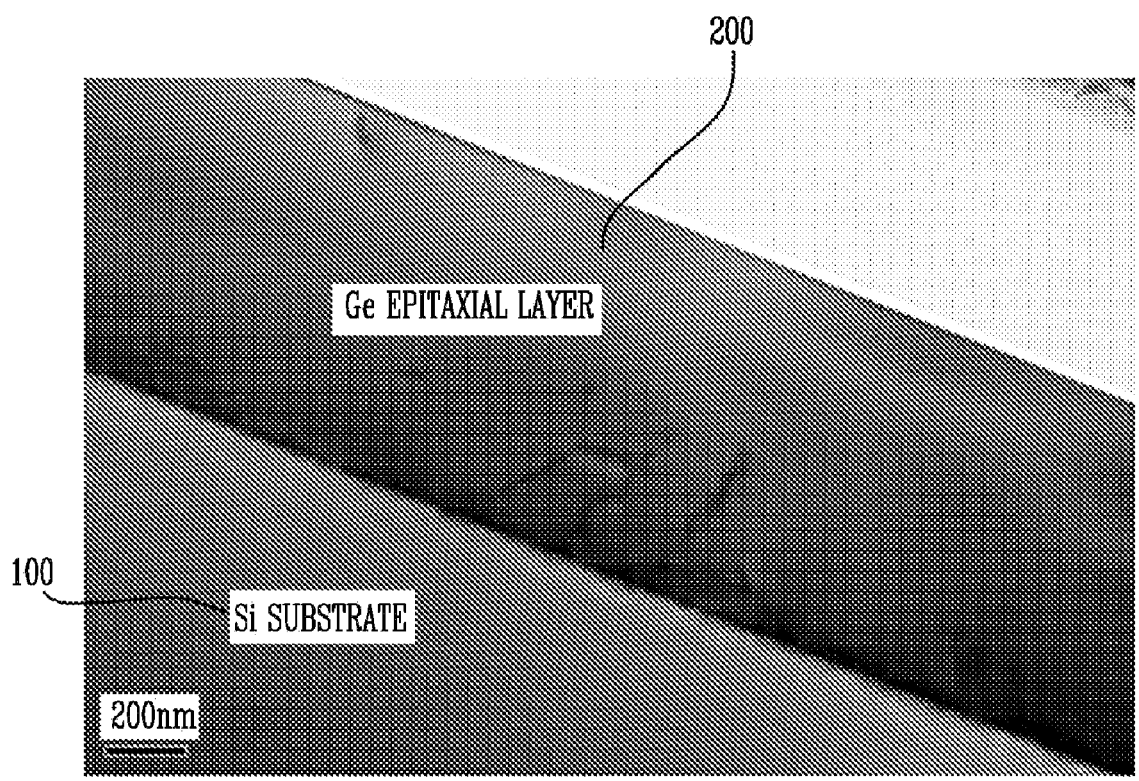
FIG. 5 is a TEM image of a cross-section of a germanium (Ge) epitaxial thin film deposited by a three-stage growth method according to an exemplary embodiment of the present invention.

Further, a cross section of a germanium (Ge) epitaxial thin film 200 grown by a three-stage growth method including low, rising and high temperatures in Example 1 was confirmed by a TEM, and the confirmed results are illustrated in FIG. 5.

It can be observed through FIG. 3 that misfit dislocations were generated across the entire surface of the low-temperature germanium (Ge) thin film 210 to alleviate a stress caused by a difference in lattice constant between silicon (Si) and germanium (Ge), most of the dislocations spread onto the surface in the shape of penetrating dislocations, and reduced surface roughness was exhibited.

Figure 4:
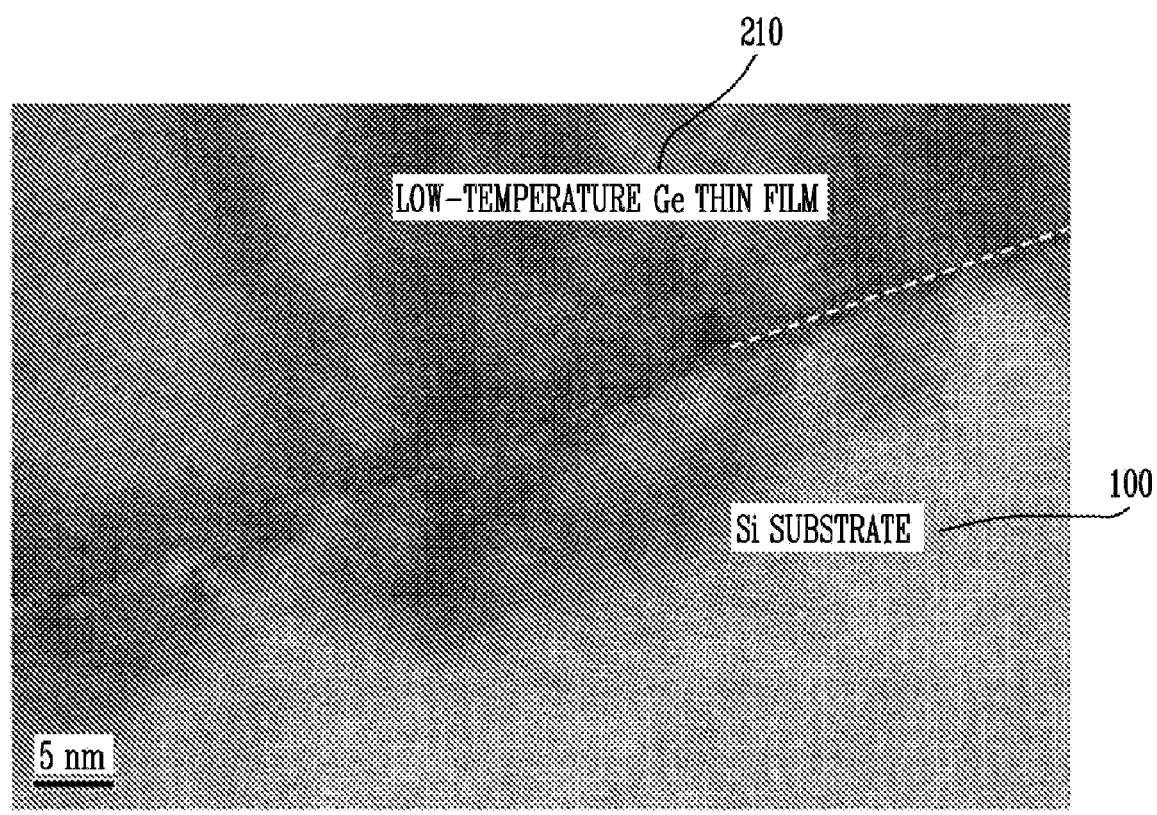
FIG. 4 is a high-resolution TEM image of a crystal structure of a low-temperature germanium (Ge) thin film according to an exemplary embodiment of the present invention.

Also, in FIG. 4, it is observed that epitaxial growth was accomplished since the low-temperature germanium (Ge) thin film 210 grown on the silicon substrate has a uniform crystal direction, and the crystal direction is exactly coincident with a silicon lattice.

According to FIG. 5, it can be confirmed that misfit dislocations and penetrating dislocations, which are generated at a low temperatures, were reduced. Also, it is confirmed that an epitaxial thin film having low density of dislocations penetrating to a surface of a germanium (Ge) thin film and a reduced surface roughness was grown.

Characteristics of X-ray Diffraction

Figure 6:
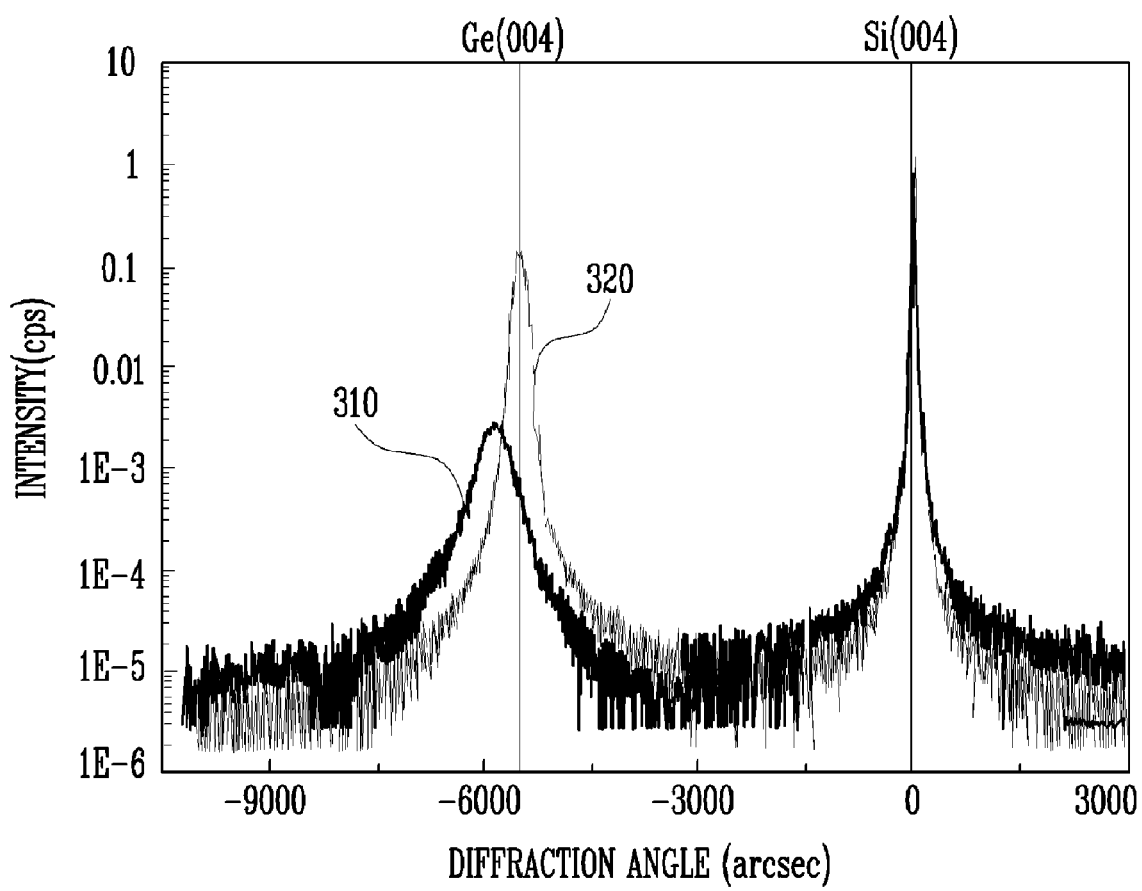
FIG. 6 is an X-ray crystallography image of a low-temperature germanium (Ge) thin film and a germanium (Ge) epitaxial thin film according to an exemplary embodiment of the present invention.

Characteristics of X-ray diffraction of the low-temperature germanium (Ge) thin film 210 grown in Example 1 and the germanium (Ge) epitaxial thin film 200 grown by the three-stage growth method including low, rising and high temperatures in Example 1 were evaluated, and the evaluated results are illustrated in FIG. 6.

According to FIG. 6, a peak 310 of the low-temperature germanium (Ge) thin film 210 exhibited a degree of stress relaxation of 94%. This is because while a misfit dislocation enables stress relaxation to be performed at a low temperature step, since the thickness of the thin film is insufficient and the process is performed at a low temperature, the germanium (Ge) film is still under a compressive stress, In contrast, a peak 320 of the germanium (Ge) epitaxial thin film 200 grown by the three-stage growth method exhibited 100% stress relaxation.

Further, as a result of analyzing X-ray diffraction results of the low-temperature germanium (Ge) thin film 210, it is confirmed that epitaxial growth was performed in a low-temperature process with no polycrystalline structure since no peak of a crystal plane is observed other than a peak in a germanium (Ge) <400> direction.

Analysis of Surface of Germanium (Ge) Epitaxial Thin Film

Figure 7:
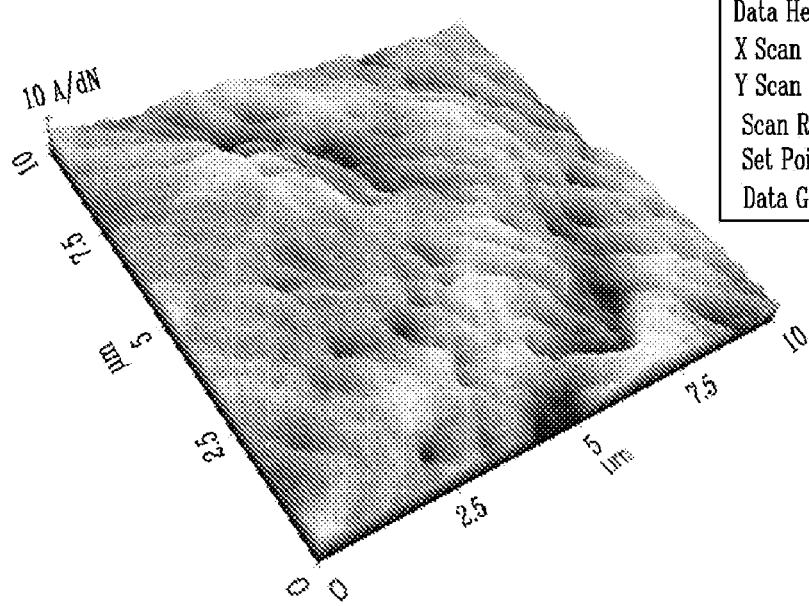
FIG. 7 is an AFM analysis image in which surface roughness of a germanium (Ge) epitaxial thin film deposited using a three-stage growth method is measured according to an exemplary embodiment of the present invention.

The surface roughness of the germanium (Ge) epitaxial thin film grown according to Example 1 of the present invention was analyzed using an atomic force microscope (AFM), and the analyzed results are illustrated in FIG. 7.

According to FIG. 7, it is confirmed that the surface is smooth, and a root mean square (RMS) roughness is 4.89 Å.

Measurement of Penetrating Dislocation Density

Figure 8:
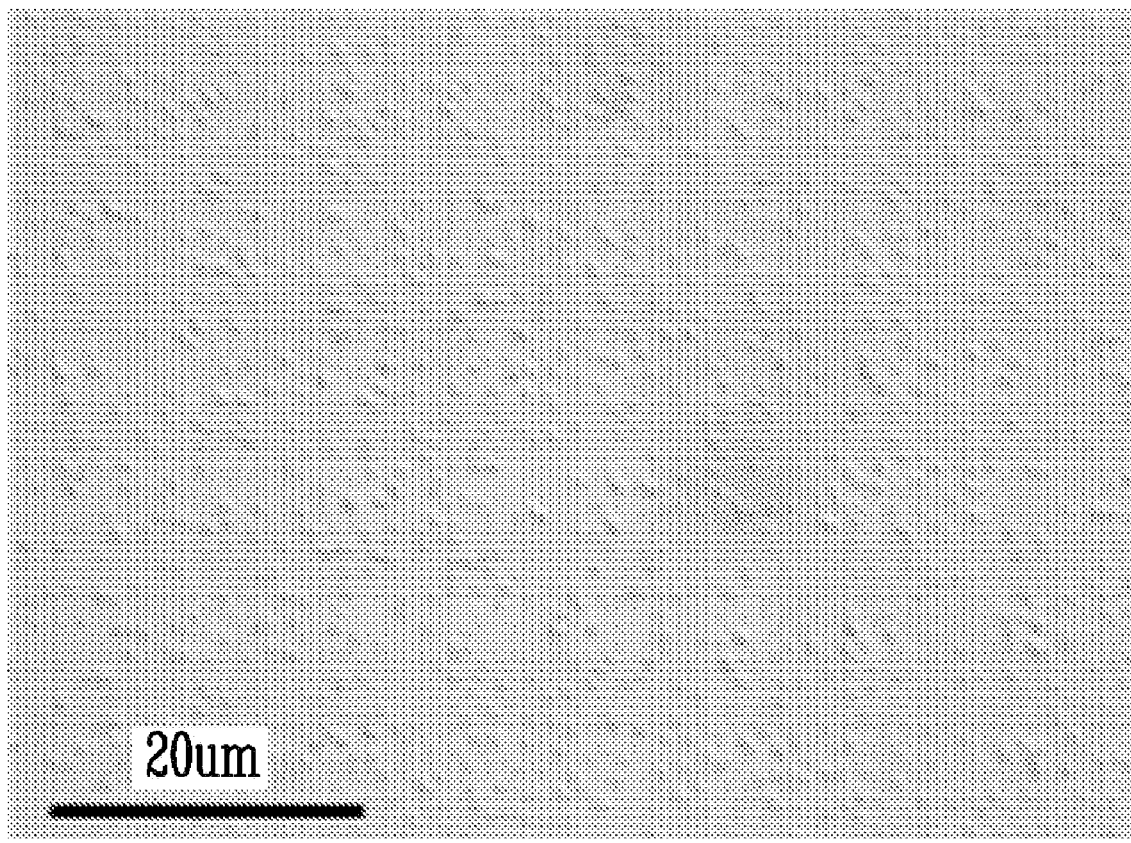
FIG. 8 is a SEM image of a thin film on which secco-etching is performed to measure penetrating dislocation density of a germanium (Ge) epitaxial thin film deposited by a three-stage growth method according to an exemplary embodiment of the present invention.

In order to measure penetrating dislocation density of the germanium (Ge) epitaxial thin film deposited using the three-stage growth method according to Example 1 of the present invention, the germanium (Ge) thin film etched using secco-etching (0.15M-$K_2Cr_2O_7$:HF:$H_2O$=1:2:30 solution for 1 min at ambient temperature) was observed using an optical microscope, and the observed results are illustrated in FIG. 8.

Secco-etching is one of the most general methods for measuring penetrating dislocation density, and the measured results show a penetrating dislocation density of $6.0 \times 10^7$ cm$^{-2}$, which is reduced dislocation density compared to that obtained in the two-stage growth method.

Figure 9:
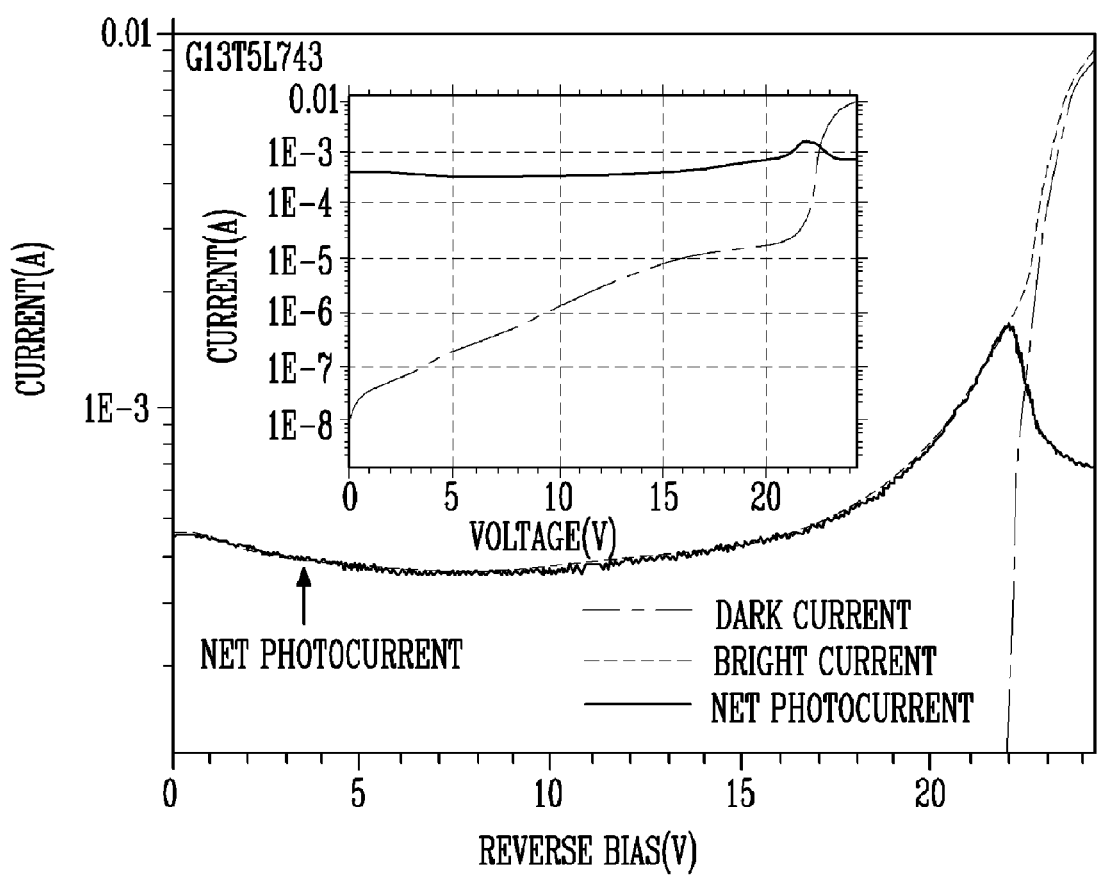
FIG. 9 is a graph showing photocurrent and voltage (I-V) characteristics of a photodiode based on the germanium (Ge) epitaxial thin film deposited by a three-stage growth method according to an exemplary embodiment of the present invention.

Evaluation of Performance of Photodiode Based on Germanium (Ge) Epitaxial Thin Film FIG. 9 is a graph showing characteristics of photocurrent and voltage of a photodiode based on the germanium (Ge) film grown in Example 1 of the present invention. As shown in the graph, a voltage range in which a net photocurrent decreases as an applied reverse bias increases is exhibited within a range of 0 to 8 V and an avalanche range of 22.5 V or higher, and thus a negative resistance phenomenon is shown in the two intervals.

Figure 10:
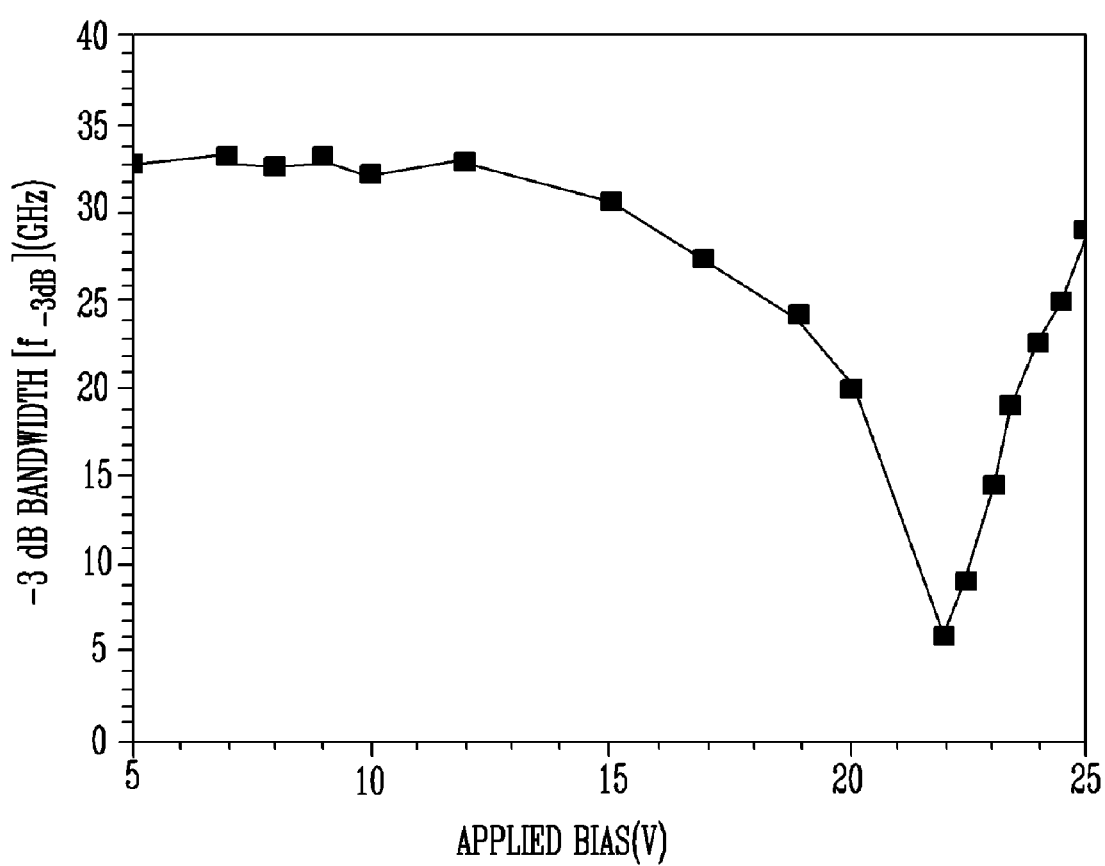
FIG. 10 is a −3 dB bandwidth ($f_{-3dB}$) graph showing fast frequency characteristics at each voltage applied to a photodiode based on a germanium (Ge) epitaxial thin film deposited by a three-stage growth method according to an exemplary embodiment of the present invention.

FIG. 10 is a graph for a −3 dB bandwidth ($f_{-3dB}$) showing fast frequency characteristics at each voltage applied to the photodiode based on the germanium (Ge) thin film grown in Example 1 of the present invention. It is observed that a high bandwidth having high speed characteristics is constantly exhibited in a first negative resistance region, the speed is gradually reduced, and the speed is increased in a negative region of 22.5 V or higher.

A method of growing a germanium (Ge) epitaxial thin film by a three-stage growth method using RPCVD enables a high-quality germanium (Ge) epitaxial thin film to be formed on a silicon substrate. In particular, excellent penetrating dislocation density and reduced surface roughness can be achieved without performing a time-consuming post-process according to an annealing process applied when a conventional germanium (Ge) thin film is grown.

Further, a germanium (Ge) photodiode fabricated by a three-stage germanium (Ge) epitaxial thin film growth method according to the present invention is superior to a conventional photodiode in terms of operating speed caused by enhanced RF effects according to negative resistance or photoconductive characteristics, and response.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of growing a germanium (Ge) epitaxial thin film, comprising:
   growing a first germanium (Ge) thin film on a silicon substrate at a low temperature;
   growing a second germanium (Ge) thin film while raising the temperature; and
   growing a third germanium (Ge) thin film at a high temperature,
   wherein each growing is performed using reduced pressure chemical vapor deposition (RPCVD), and the first, second and third germanium (Ge) thin films grown by the above steps have negative photoconductance characteristics.

2. The method of claim 1, wherein the growing of the first germanium (Ge) thin film at a low temperature is performed at a deposition temperature of about 350 to about 450° C. under a pressure of about 10 to about 90 Torr to grow the thin film to a thickness of about 80 to about 120 nm.

3. The method of claim 1, wherein the growing of the second germanium (Ge) thin film while raising the temperature is performed on the first germanium (Ge) thin film by raising a temperature from about 350 to about 450° C. to about 600 to about 700° C. at a rate of about 5 to about 15° C. per minute to grow the second thin film to a thickness of about 180 to about 220 nm.

4. The method of claim 1, wherein the growing of the third germanium (Ge) thin film at a high temperature is performed on the second germanium (Ge) thin film at a deposition temperature of about 600 to about 700° C. under a pressure of about 10 to about 90 Torr.

5. The method of claim 1, wherein a deposition rate in raising the temperature to grow the second germanium (Ge) thin film is the same as that in growing the first germanium (Ge) thin film at a low temperature, and a deposition rate in growing the third germanium (Ge) thin film at a high temperature is at least twice that in growing the first germanium (Ge) thin film at a low temperature.

6. A method of growing a germanium (Ge) epitaxial thin film, comprising:
   growing a low-temperature germanium (Ge) thin film on a silicon substrate at a first temperature;
   growing a rising-temperature germanium (Ge) thin film on the low-temperature germanium (Ge) thin film under temperature that continuously changes from the first temperature to a second temperature higher than the first temperature; and
   growing a high-temperature germanium (Ge) thin film on the rising-temperature germanium (Ge) thin film at the second temperature.

* * * * *